April 26, 1966 A. X. WIDMER 3,248,572

VOLTAGE THRESHOLD DETECTOR

Filed May 13, 1963 2 Sheets-Sheet 1

INVENTOR
ALBERT X. WIDMER

BY Edward G. Fiorito
ATTORNEY

April 26, 1966 A. X. WIDMER 3,248,572

VOLTAGE THRESHOLD DETECTOR

Filed May 13, 1963

2 Sheets-Sheet 2

United States Patent Office 3,248,572

Patented Apr. 26, 1966

3,248,572
VOLTAGE THRESHOLD DETECTOR

Albert X. Widmer, Peekskill, N.Y., assignor to International Business Machines Corporation, New York, N.Y., a corporation of New York Filed May 13, 1963, Ser. No. 279,839
5 Claims. (Cl. 307—88.5)

Figures 1, 3, 4:
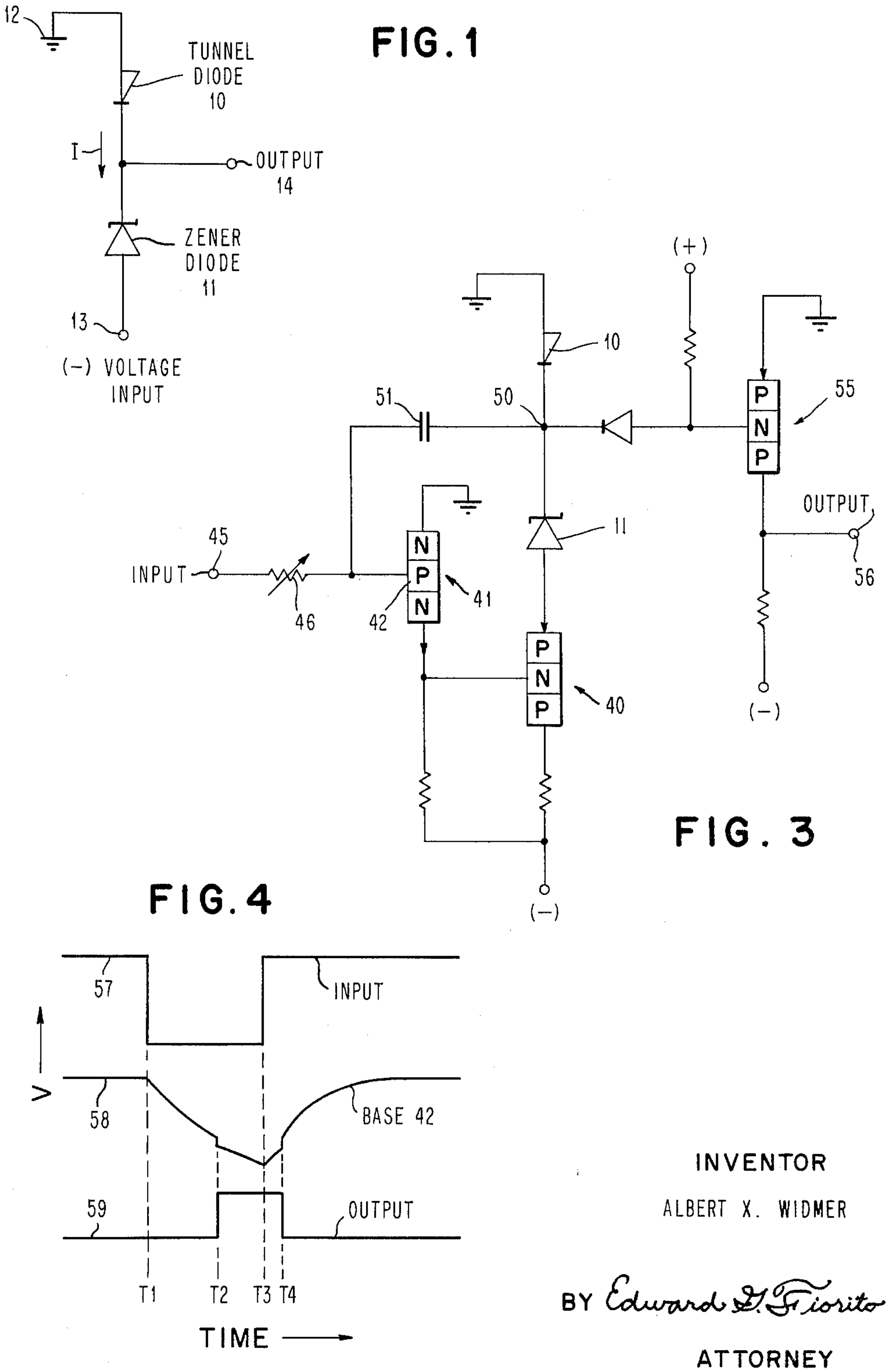

This invention relates to voltage threshold detectors and, more particularly, to such detectors having reduced sensitivity to temperature variations.

The characteristics of electrical components are known to vary with temperature. These variations often cause inaccuracies in electrical circuits resulting in faulty or ineffective operation. This problem becomes especially acute in voltage threshold detectors. The purpose of such detectors is to detect when a voltage increases to a certain threshold value. This value ordinarily must be constant and independent of changes in the electrical components of the detector brought about by temperature variations.

Accordingly, it is an object of the present invention to provide an improved voltage threshold detector which operates without variations due to temperature changes.

The electrical characteristics of Zener diodes and Esaki diodes, the latter also known as the tunnel diodes as hereinafter referred to, are known to vary with changes in temperature. This would ordinarily make them unsuitable for use in voltage threshold detectors where large temperature variations are experienced. However, it is known that these components exhibit other advantages which make them desirable for use in voltage threshold detectors. The Zener diode exhibits a large breakdown current when the voltage exceeds a certain threshold. A tunnel diode placed in series with the Zener diode is capable of generating a pulse in response to the breakdown current.

It is therefore a further object of the present invention to provide an improved voltage threshold detector employing to advantage a Zener diode and a tunnel diode wherein the operation is substantially independent of temperature variations.

It is well known that the tunnel diode switches very rapidly between two stable states. In circuits employing tunnel diodes, a problem is often caused by transients set up during the rapid switching of the tunnel diode. These transients set up undesirable oscillations in the circuit which must be suppressed in order to achieve satisfactory operation.

An additional object of the present invention is to provide an improved voltage threshold detector employing to advantage a Zener diode and a tunnel diode, wherein oscillations set up by the switching of the tunnel diode are suppressed.

These and other objects of the present invention are accomplished in accordance with the broad aspects of the present invention by selecting a tunnel diode and a Zener diode having certain matched electrical characteristics. The tunnel and the Zener diodes are connected in series with the forward direction of current flow in one diode opposing the forward direction of current flow in the other diode. By examining the electrical characteristics of the Zener diode, a current value can be found for which variations in temperature have little or no effect upon the voltage across the Zener diode. When conducting this amount of current, the Zener diode is said to exhibit a zero temperature coefficient.

The tunnel diode switches from the low voltage state to the high voltage state when a certain peak current is reached. In accordance with the present invention, the peak current of the tunnel diode is selected to equal the zero temperature coefficient current of the Zener diode. In this manner, the tunnel diode is made to switch each time the voltage across the Zener diode reaches a certain value, which is constant and independent of temperature variations.

In accordance with another aspect of the present invention, a capacitor is connected to the series circuit formed by the tunnel and Zener diodes. One end of the capacitor is connected between the two diodes and the other end of the capacitor is connected to a means for controlling the flow of current through the series circuit. The pulse caused by the switching of the tunnel diode is fed back through the capacitor to the amplifier. By connecting the capacitor in this manner, a positive feedback is effected which drives the series circuit into further conduction, thereby suppressing oscillations set up by the switching of the tunnel diode.

An advantageous feature of the present invention is the simplicity of the voltage detector which employs only two components. Due to the novel manner in which the electrical characteristics of these two components are matched, the effect of temperature variations is reduced without the use of additional electrical components increasing the cost of construction.

A feature of the capacitor modified form of the present invention is the dual function that this capacitor can be made to perform. In addition to suppressing oscillations, the capacitor can cooperate in an integrating circuit. When performing this latter function, the voltage detector is readily converted into a time delay circuit as described in detail below.

Figure 2C:
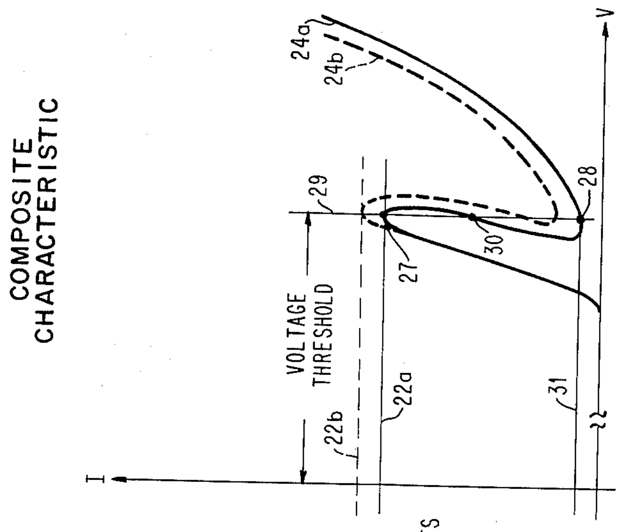
Figure 2B:
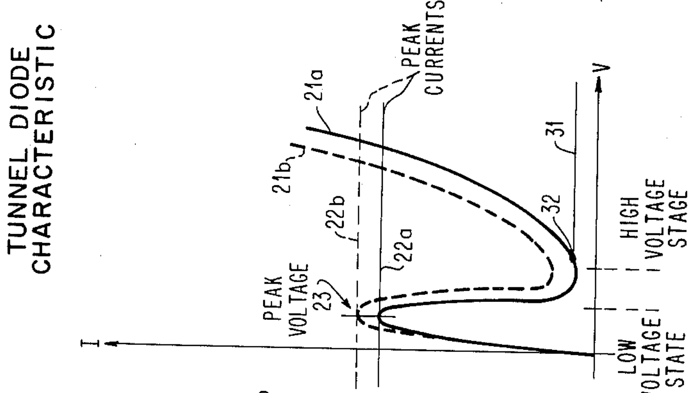
Figure 2A:
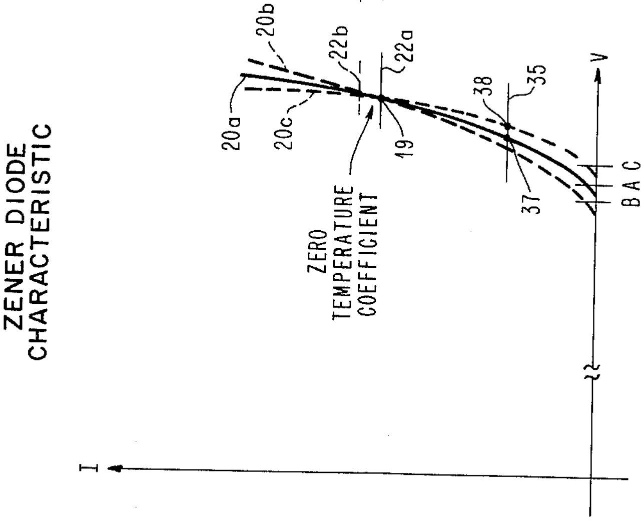

The foregoing and other objects, features and advantages of the invention will be apparent from the following more particular description of preferred embodiments of the invention, as illustrated in the accompanying drawings:

FIG. 1 is an electrical schematic of an embodiment of the present invention;

FIGS. 2A, 2B, and 2C are graphs illustrating the electrical characteristics of the components shown in FIG. 1;

FIG. 3 is an electrical schematic of a time delay circuit embodying the present invention; and FIG. 4 is a waveform diagram illustrating the signals at various points in the circuit shown in FIG. 3.

FIG. 1 shows a voltage threshold detector embodying the present invention. A tunnel diode 10 and a Zener diode 11 are connected in series between a source of ground potential 12 and a voltage input terminal 13. When a negative input is applied at terminal 13, current flows from the ground potential 12 to the terminal 13. This current flows in the forward direction through tunnel diode 10, and in the reverse direction through the Zener diode 11.

The function of the circuit is to detect when the voltage input on terminal 13 exceeds a certain negative voltage threshold. When this occurs, the tunnel diode switches from its low voltage state to its high voltage state. The switching of the tunnel diode generates a pulse at output terminal 14 which may be utilized in any manner by suitable circuitry connected to the output terminal 14. One example of such circuitry is shown in FIG. 3 and is described in detail later in this specification.

FIGS. 2A, 2B, and 2C illustrate the current-voltage characteristics of Zener diode 11, tunnel diode 10, and the composite characteristics of the two diodes in series. Curve 20*a* illustrates the reverse current-voltage characteristic of the Zener diode 11 for one temperature. Curves 20*b* and 20*c* illustrate the characteristics of the Zener diode 11 for higher and lower temperatures, respectively. It has been found that for most Zener diodes the curves 20*a*, 20*b*, and 20*c* intersect in the region about a point 19. When the current passing through the Zener diode 11 in the reverse direction is equal to an amount illustrated by line 22a passing through point 19, the voltage across the Zener diode is constant and independent of temperature variations. At this current value 22a, the Zener diode 11 exhibits a zero temperature coefficient.

The Zener diode breaks down passing a relatively large amount of current when the voltage exceeds magnitude A, B, or C at the knee of the curves 20a, 20b, and 20c, respectively. This breakdown can be made to vary with different Zener diodes but is usually in the order of a number of volts, typically in the neighborhood of 6 volts. The ordinate axis in FIG. 2A is broken so that the voltage scale can be expanded to illustrate the details above the knee of the curves.

Curve 21a in FIG. 2B illustrates the current-voltage characteristics of the tunnel diode 10 for a temperature corresponding to the temperature for curve 20a in FIG. 2A. Curve 21b illustrates the characteristics at another temperature corresponding to the temperature for curve 20b in FIG. 2A. The tunnel diode 10 has low and high voltage states and an unstable negative resistance region therebetween. The tunnel diode 10 switches from the low to the high state when a peak current 22a or 22b is reached depending upon the temperature. As illustrated in FIG. 2B, the peak voltage 23 remains relatively constant with temperature as compared to the variations in peak current.

In order to aid in explaining the series operation of the Zener diode 11 and tunnel diode 10, a composite characteristic is shown in FIG. 2C. Curve 24a illustrates the current-voltage characteristic of the diodes 10 and 11 in series for a temperature corresponding to curves 20a and 21a. Curve 24b corresponds in temperature to curves 20b and 21b.

The voltage across the series circuit shown in FIG. 1 is equal to the sum of the voltages across the individual diodes 10 and 11. Therefore, the composite voltage for any given current can be plotted in FIG. 2C by adding the corresponding voltages in FIGS. 2A and 2B. The resultant composite curves 24a and 24b resemble the tunnel diode curves 21a and 21b slightly inclined to the right due to the slope of the Zener diode curves 20a and 20b.

The circuit of FIG. 1 operates as follows. Before the negative input voltage applied to terminal 13 reaches the Zener diode breakdown voltage A, B, or C, most of this input voltage is supported across the Zener diode 11. This is due to the very small amount of current conducted by the Zener diode in the reverse direction which, in turn, results in a very small voltage drop across the tunnel diode. However, when the breakdown voltage is exceeded, the Zener diode begins conducting a relatively large amount of current. This current continues to increase sharply as the voltage increases until the peak current of the tunnel diode is reached. This point is illustrated in the composite curve 24a of FIG. 2C at 27 for a temperature corresponding to the one illustrated by curve 24a. At this time, assuming that the voltage remains constant on input terminal 13 as illustrated by a line 29, the current drops from point 27 to point 28. Although the constant voltage line 29 intersects the curve 24a at point 30, this current value is in the unstable negative resistance region of the tunnel diode 10. Therefore, the diode 10 continues to switch through the negative resistance region to the high voltage state. The voltage across the Zener diode 11 decreases a corresponding amount so that the composite voltage remains the same as illustrated by point 28. The series current flow through the tunnel diode is illustrated by line 31 in FIGS. 2B and 2C. The line 31 intersects the tunnel diode curve 21a at point 32. Switching of the tunnel diode from peak current 22a to current 31 results in a corresponding voltage transition from peak voltage 23 to point 32. This rapid change in voltage generates a pulse at output terminal 14 which may be utilized by any suitable device.

By selecting the peak current 22a of the tunnel diode to equal a current for which the Zener diode exhibits a zero temperature coefficient, the tunnel diode can be made to switch each time the input voltage on terminal 13 reaches a certain threshold voltage. This value remains relatively constant with temperature because the voltage across the Zener diode is substantially invariant with temperature in the region about point 19. To illustrate this, the composite waveform 24b is shown. Since the peak current 22b of the tunnel diode is higher for this temperature, the composite curve 24b is shifted upward. The point at which peak current 22b intersects the Zener diode characteristic curve 20b is slightly inclined to the right of point 19 due to the natural slope of the Zener diode characteristic curve. Therefore, the voltage threshold detected on terminal 13 for this temperature is slightly greater than that illustrated by voltage 29 in FIG. 2C. This is due almost entirely to the natural slope of the Zener diode characteristic curve 20b which is ordinarily small. Very little change is introduced due to temperature because the curves 20a and 20b are practically overlapped in the region about point 19.

Temperature would have a large effect upon the operation of the voltage detector if, for example, the peak current of the tunnel diode were selected to be in the region of the Zener diode characteristic illustrated by line 35. For this case, the voltage variation across the Zener diode due only to temperature would be illustrated by the difference between points 37 and 38. It can be seen that a significant reduction in the effect due to temperature is achieved by selecting the peak current of the tunnel diode to be in the region about point 19.

FIG. 3 illustrates a modification of the threshold detector of FIG. 1. One feature of this circuit is the manner in which undesirable oscillations caused by the switching of the tunnel diode 10 are suppressed. A transistor 40 is connected in series with the Zener diode 11 and tunnel diode 10. Current flowing through these diodes is controlled by the conduction of transistor 40. A transistor 41 is connected in an emitter-follower configuration, the output being coupled to the base transistor 40. Signals applied to a base 42 of transistor 41 control the conduction of transistors 41 and 40 and therefore the current through the Zener and tunnel diodes. Voltages are applied to an input terminal 45 and are coupled through a variable resistor 46 to the base 42. As the voltage on terminal 45 decreases, conduction through diodes 10 and 11 increases toward the peak current value of the tunnel diode 10. When the peak current is reached, tunnel diode 10 switches from the low voltage state to the high voltage state in the manner discussed above. The switching of the tunnel diode 10 causes the voltage to drop rapidly at node 50. A capacitor 51 is connected between the node 50 and base 42. Since the voltage across capacitor 51 can not change instantaneously, the negative voltage drop at node 50 is coupled through the capacitor 51 back to the base 42. This voltage drop coupled to base 42 causes the current through the transistor 40 to increase rapidly and, in turn, to increase in conduction through the tunnel diode 10 and Zener diode 11. The rapid increase in conduction drives the tunnel diode further into the high voltage state and away from the negative resistance region, thereby suppressing oscillations set up during the transition from the low voltage state to the high voltage state. The signal coupled through the capacitor 51 back to the base 42 is in the nature of a positive feedback signal. As in the case of most electrical circuits, positive feedback tends to quickly stabilize the circuit of FIG. 3.

The capacitor 51 can be made to perform another function in addition to providing positive feedback as described above. By controlling the rate of charge on capacitor 51, the capacitor acts as an integrating circuit causing the circuit of FIG. 3 to perform the function of a highly accurate time delay circuit. To illustrate this operation of the circuit of FIG. 3, waveforms 57–59 are shown in FIG. 4. At time T1, the voltage on terminal 45 drops to a negative value. Current flows through tunnel diode 10, capacitor 51 and resistor 46 charging capacitor 51. The value of resistor 46 must be large enough to prevent the charging current from exceeding the peak current of the tunnel diode 10 in order to prevent a premature switching of the tunnel diode 10. The voltage on base 42 begins to decrease as capacitor 51 charges. At time T2, the base 42 reaches a value which is sufficient to cause a peak current to flow through tunnel diode 10. When the peak current is reached, the tunnel diode 10 switches from the low voltage state to the high voltage state. The voltage at node 50 decreases sharply causing a negative voltage step to be fed back through capacitor 51 to the base 42. This negative voltage step is illustrated in waveform 58 at time T2.

Switching of the tunnel diode 10 at time T2 generates a negative pulse supplied to the base of a transistor 55 which is one example of a utilization device that could also be connected to output terminal 14. Transistor 55 is connected in an inverter configuration and produces a positive voltage step at output terminal 56 in response to the negative tunnel diode pulse. This output is illustrated by waveform 59. The leading edge of waveform 59 is delayed with respect to the leading edge of waveform 57 by an amount equal to the charging time of the capacitor 51.

After time T2, the potential at the base 42 normally drops still further until it has reached the input potential. When the input at terminal 45 is returned to ground at time T3, the potential at the base 42 starts rising again exponentially. The current through tunnel diode 10 decreases. When the current through the tunnel diode 10 falls below the valley current at time T4, the tunnel diode returns to the low voltage state and the output 59 drops again. After time T4, the voltage at base 42 continues to approximate the input voltage exponentially.

Although in the illustrated embodiment of the invention in FIG. 1, the tunnel diode is connected to a constant ground potential while the voltage input is applied to the Zener diode, the connection of the constant potential source may be reversed. That is, the Zener diode may be connected to a constant voltage source while the tunnel diode 10 is supplied with a varying voltage input. It is apparent that such a voltage detector would operate in the manner described above so long as current flow through the tunnel diode is in the forward direction.

It is also apparent that the peak current of the tunnel diode need not be exactly equal to the point 19 in FIG. 2A in order to utilize the advantage of the present invention. As illustrated in FIG. 2A, curves *20a*, *20b*, and *20c* overlap in a region about point 19. It is in this region of overlap that temperature has only a limited effect upon the operation of the Zener diode.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A voltage threshold detector capable of determining when the voltage between a pair of terminals reaches a threshold value comprising:

a Zener diode having a substantially zero temperature coefficient for a certain current value;

a tunnel diode having a peak current value equal to said certain current value; and circuit means connecting said Zener and tunnel diodes in series between said pair of terminals so that the voltage on said terminals produces a current flow in the forward direction through said tunnel diode and in the reverse direction through said Zener diode, whereby said tunnel diode switches each time the voltage across said Zener diode reaches a certain magnitude independent of variations in temperature.

2. A voltage threshold detector capable of determining when the voltage between a pair of terminals reaches a threshold value comprising:

a Zener diode having reverse current-voltage characteristics such that conduction of a certain current value provides a voltage drop substantially invariant with temperature;

a tunnel diode having a high voltage state and a low voltage state, transition from said low state to said high state occurring at a current equal to said certain current value; and circuit means connecting said Zener and tunnel diodes in series between said pair of terminals so that the voltage on said terminals produces a current flow in the forward direction through said tunnel diode and in the reverse direction through said Zener diode, whereby said tunnel diode switches each time the voltage across said Zener diode reaches said voltage drop substantially invariant with temperature.

3. Apparatus as defined in claim 2 further characterized by the addition of means connected to said series circuit at a point located between said Zener diode and said tunnel diode for providing a signal in response to the switching of said tunnel diode.

4. A voltage threshold detector comprising:

a Zener diode having reverse current-voltage characteristics such that conduction of a certain current value provides a voltage drop substantially invariant with temperature;

a tunnel diode having a high voltage state and a low voltage state, transition from said low state to said high state occurring at a current equal to said certain current value;

circuit means connecting said Zener and tunnel diodes in series with forward direction of current flow in one of said diodes opposing the forward direction of current flow in the other of said diodes;

control means connected across said series circuit for supplying and controlling the conduction of current through said series circuit in response to the application of a signal to an input of said control means, whereby said tunnel diode switches each time the voltage acrosss aid Zener diode reaches said voltage drop substantially invariant with temperature;

a capacitor connected between the input of said control means and a point in said series circuit located between said tunnel and Zener diodes, whereby said capacitor provides a positive feedback causing said control means to effect an increase in conduction in current through said series circuit in response to the switching of said tunnel diode.

5. A circuit for delaying input signals comprising:

a Zener diode having reverse current-voltage characteristics such that conduction of a certain current value provides a voltage drop substantially invariant with temperature;

a tunnel diode having a high voltage state and a low voltage state, transition from said low state to said high state occurring at a current equal to said certain current value;

circuit means connecting said Zener and tunnel diodes in series with forward direction of current flow in one of said diodes opposing the forward direction of current flow in the other of said diodes;

control means connected across said series circuit for supplying and controlling the conduction of current through said series circuit in response to signal variations upon an input terminal of said control means, whereby said tunnel diode switches each time the voltage across said Zener diode reaches said voltage drop substantially invariant with temperature;

means for integrating said input signals including a capacitor connected between the input terminal of said control means and a point in said series circuit located between said Zener and tunnel diodes, and including a resistor connected to said input terminal and adapted to receive said input signals, whereby said control means receives an integrated function of said input signals.

References Cited by the Examiner

UNITED STATES PATENTS

| | | | |
|---|---|---|---|
| 3,142,767 | 7/1964 | Cornish | 307—88.5 |

JOHN W. HUCKERT, *Primary Examiner.*

ARTHUR GAUSS, *Examiner.*

J. BUSCH, *Assistant Examiner.*